(12) United States Patent
Oh et al.

(10) Patent No.: US 10,593,578 B2
(45) Date of Patent: Mar. 17, 2020

(54) INITIALIZATION SETTING METHOD FOR RF COMMUNICATION OF UNMANNED TRANSPORTING DEVICE IN AUTOMATED MATERIAL HANDLING SYSTEM

(71) Applicant: Hak Seo Oh, Gyeonggi-do (KR)

(72) Inventors: Hak Seo Oh, Gyeonggi-do (KR); Youl Kwon Sung, Gyeonggi-do (KR)

(73) Assignee: Hak Seo Oh, Gyeonggi-do (KR)

( * ) Notice: Subject to any disclaimer, the term of this patent is extended or adjusted under 35 U.S.C. 154(b) by 148 days.

(21) Appl. No.: 15/845,013

(22) Filed: Dec. 18, 2017

(65) Prior Publication Data
US 2019/0148197 A1   May 16, 2019

(30) Foreign Application Priority Data
Nov. 10, 2017   (KR) .................. 10-2017-0149105

(51) Int. Cl.
*H01L 21/67* (2006.01)
*H01L 21/677* (2006.01)
*G05B 19/418* (2006.01)
*H04W 84/10* (2009.01)
*H04W 76/11* (2018.01)
*G06K 19/07* (2006.01)
*H04W 76/14* (2018.01)

(52) U.S. Cl.
CPC .... *H01L 21/67724* (2013.01); *G05B 19/4189* (2013.01); *G06K 19/0723* (2013.01); *H01L 21/67276* (2013.01); *H01L 21/67294* (2013.01); *H01L 21/67733* (2013.01); *H04W 76/11* (2018.02); *H04W 76/14* (2018.02); *H04W 84/10* (2013.01)

(58) Field of Classification Search
CPC ......... G05D 1/0022; G05D 2201/0216; G05B 19/4189; G06K 19/0723
USPC .......................................... 700/245–264, 228
See application file for complete search history.

(56) References Cited

U.S. PATENT DOCUMENTS

| | | | | |
|---|---|---|---|---|
| 8,594,842 B2 * | 11/2013 | Abramson | ............... | G01S 1/70 318/567 |
| 10,289,105 B1 * | 5/2019 | Oh | ................... | G05B 19/41895 |
| 2007/0276540 A1 * | 11/2007 | Okuda | ................ | G05D 1/0272 700/245 |

FOREIGN PATENT DOCUMENTS

| KR | 101527686 | 6/2015 |
|---|---|---|
| KR | 101616706 | 5/2016 |

* cited by examiner

*Primary Examiner* — Timothy R Waggoner
(74) *Attorney, Agent, or Firm* — IPLA P.A.; James E. Bame (57) ABSTRACT

Provided is a technique which performs an RF initialization setting process using a data input/output terminal in an unmanned transporting device without providing a separate terminal to build an RF communication based automated material handling system while minimizing a structural change of an optical communication based unmanned transporting device which has been already provided.

7 Claims, 5 Drawing Sheets

INITIALIZATION SETTING METHOD FOR RF COMMUNICATION OF UNMANNED TRANSPORTING DEVICE IN AUTOMATED MATERIAL HANDLING SYSTEM

CROSS REFERENCE

The present application claims priority to Korean Patent Application No. 10-2017-0149105, filed 10 Nov. 2017, the entire contents of which is incorporated herein for all purposes by this reference.

BACKGROUND

The present disclosure relates to a technique which performs an RF initialization setting process using a data input/output terminal in an unmanned transporting device without providing a separate terminal to build an RF communication based automated material handling system while minimizing a structural change of an optical communication based unmanned transporting device which has been already provided.

Generally, in manufacturing processes of a liquid crystal display device and a semiconductor element, the manufacturing goods are transferred to the manufacturing stations of each manufacturing process by using an automated material handling system (AMHS), so that the corresponding goods are manufactured according to the manufacturing processes of each manufacturing station. Such an automated material handling system utilizes an unmanned transporting device for transferring a carrier of receiving a semiconductor substrate or a liquid crystal substrate to the manufacturing station located on the manufacturing process line and transferring the carrier of again receiving the goods completely processed in the corresponding manufacturing station to the next manufacturing station.

Depending on the movement method thereof, the unmanned transporting device includes an automated guided vehicle (AGV) for driving through the wheel, a rail guided vehicle (RGV) for driving along the guide rail located at the bottom, and an overhead hoist transport (OHT) for driving a guide rail installed in the ceiling. These unmanned transporting devices are moved to the corresponding manufacturing facility by using the wheel itself or along the bottom rail or the overhead rail and it carries the carrier onto or carries the carrier out the manufacturing facility by using an operating arm or a hoist and a hand.

The carrying/carrying out of the carriers is accomplished by the host computers mounted on the unmanned transporting device and the manufacturing facility under the control of the main controller for controlling the entire manufacturing lines. At this time, since it requires the interlock operation between the unmanned transporting device and the manufacturing facility during the carrying/carrying out of the carrier, transmission devices of an optical communication mode using an IR (Infrared) are installed on the unmanned transporting device and the manufacturing facility respectively so as to send and receives the necessary data, thereby smoothly performing the carrying/carrying out of the carriers.

Figure 1:
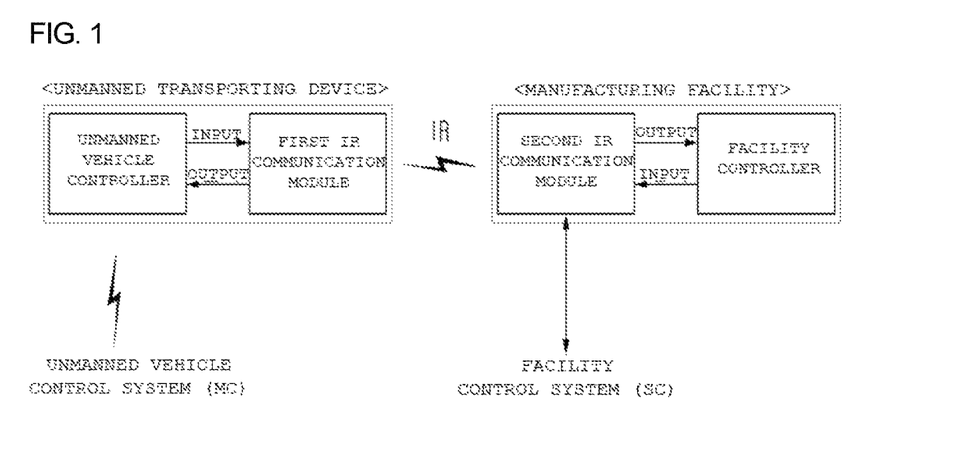
FIG. 1 is a schematic diagram illustrating a communication system for automated material handling system using a conventional IR optical communication.

FIG. 1 is a schematic diagram illustrating a communication system for automated material handling system using a conventional IR optical communication. In the practice of the communication using this way, there is a disadvantage in that communication units between an unmanned transporting device and a manufacturing facility should be installed in close proximity as possible. Accordingly, in order to communicate with the unmanned transporting device installed on the ceiling using the IR optical communication, the communication unit of the manufacturing facility must be installed on the ceiling in like manner.

Owing to this installation constraint, the cable of the communication unit for facility should be lengthily installed along the ceiling having above 5 m height. Also, it has difficulty in the beauty and management inside the plant. Moreover, since it send and receive the communication without the generation of a unique ID, the communication interference between adjacent communication devices can be generated due to the optical noise.

Where it replaces the IR optical communication module with the RF (Radio-Frequency) communication module so as to overcome the above drawbacks, since the data is transmitted through the ID, it can avoid the problem of the interference. Also, although the communication unit for equipment is not installed on the ceiling, the communication between the unmanned transporting device and the manufacturing facility can be made.

Figure 2:
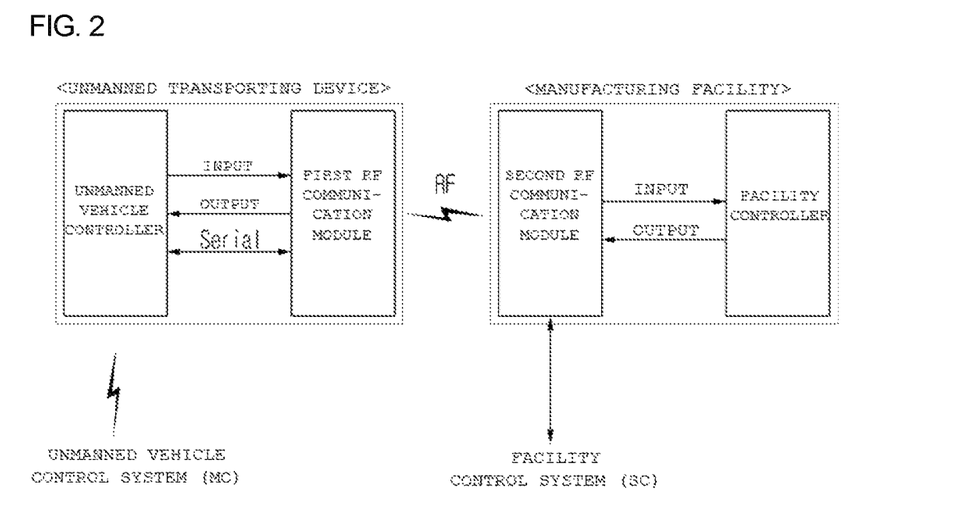
FIG. 2 and FIG. 3 are schematic diagrams illustrating a communication system for automated material handling system using a conventional RF communication.

FIG. 2 is a schematic diagram illustrating a communication system for automated material handling system using a conventional RF communication. In this RF communication method, since each manufacturing facility should be given a unique ID every the manufacturing facility, the unmanned transporting device recognizes the corresponding ID for manufacturing facility and communication channel information and then, it should be set for RF communication module in the unmanned vehicle controller, so that the communication between the unmanned transporting device and the manufacturing facility can be made. At this time, the corresponding ID and the communication channel information are inputted to the communication modules of each manufacturing facility in advance.

Figure 3:
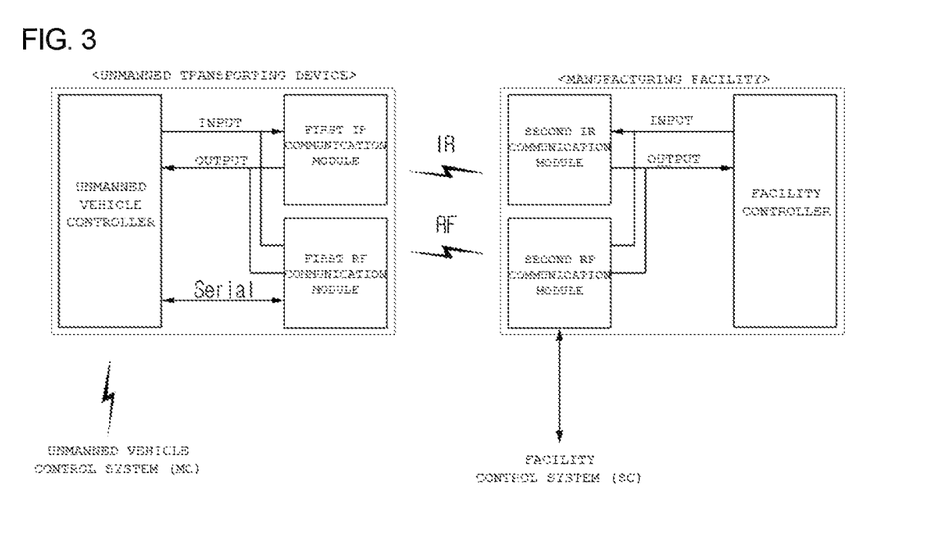

Recently, as shown in FIG. 3, the unmanned transporting device is provided with both of IR communication module and RF communication module, so that the automated material handling system capable of selectively utilizing the optical communication method and the RF communication method has been proposed. In this communication method, any one of the optical communication method and the RF communication method can be selectively utilized so as to minimize the data transmission error owing to the surrounding environment in response to the position of the manufacturing facility.

That is, in the automated material handling system using the RF communication method, the demand for more accurate data transmitting and receiving between the unmanned transporting device and the manufacturing facility has been increased.

However, where the automated material handling system using the conventional optical communication method is already established in the factory or it tries to establish a new automated material handling system using the RF communication method onto the existing system, since the communication module never have the ID setting function in automated material handling system using the conventional IR optical communication method, the structure of the unmanned vehicle controller of the unmanned transporting device should be changed over all during the replacement of communication module (IR mode→RF mode) or the addition thereof (IR mode→IR mode+RF mode) so as to provide the ID setting function.

That is, as shown in FIG. 1, in the IR optical communication method, only input and output terminals are connected between the unmanned vehicle controller of the unmanned transporting device and the communication module. However, as shown in FIG. 2 and FIG. 3, since it performs the ID and channel setting through the serial terminal in the RF communication method, the unmanned vehicle controller of the unmanned transporting device should be newly developed.

Thus, in order to change the automated material handling system using the conventional optical communication method to the automated material handling system using the RF communication method, since the unmanned transporting device should be changed or replaced over all, the facility lines should be suspended for a number of years. Accordingly, there are problems in that a lot of time and cost and an inconvenience of a user are involved.

SUMMARY OF THE INVENTION

The invention has been made in consideration of the circumstances described above, and a technical object of the present invention is to provide an initialization setting method for RF communication of an unmanned transporting device in an automated material handling system which transports a carrier between manufacturing facilities by performing RF communication with an unmanned transporting device, in which control data or RF initialization setting data is selectively provided to an unmanned vehicle communication module according to a status value of a selecting terminal by an unmanned vehicle controller of the unmanned transporting device to easily change to an RF communication based automated material handling system without changing a structure of an optical communication based unmanned vehicle controller which has been already provided.

According to an aspect of the invention to achieve the object described above, there is provided an RF initialization setting method of an unmanned transporting device in an automated material handling system which includes an unmanned transporting device configured to convert information transmitted through a data terminal in a state when a selecting terminal is set to a second level into an RF signal to transmit the converted RF signal to a manufacturing facility, and performs RF communication with the unmanned transporting device to transport a carrier to the manufacturing facility, the method including: a data stream generating step of generating a data stream which is formed of a setting value and a command value in a predetermined bit unit for a setting value for each RF initialization parameter and has a bit number corresponding to the number of data terminals by the unmanned vehicle controller of the unmanned transporting device, in which at least one data stream is generated for one RF initialization parameter; an initialization information transmitting step of setting a state of the selecting terminal to a first level and transmitting information in a data stream unit to an unmanned vehicle communication module through a data terminal, by the unmanned vehicle controller; and a setting value registering step of receiving a data stream applied from the unmanned vehicle controller through a data terminal in a state when the selecting terminal is a first level and obtaining and sequentially disposing unit setting values based on command values of the received data stream to regenerate and register a setting value for each parameter, by the unmanned vehicle communication module.

Preferably, the initialization information transmitting step includes: an initialization mode setting step of transmitting communication setting mode starting information to the unmanned vehicle communication module and receiving communication setting mode starting confirmation information from the unmanned vehicle communication module, by the unmanned vehicle controller; an RFID information transmitting step of sequentially transmitting at least one data stream corresponding to the RFID by the unmanned vehicle controller to the unmanned vehicle communication module to perform a setting value transmitting process for the RFID, in which when reception confirmation information for the data stream is received from the unmanned vehicle communication module, a data stream of next level is transmitted; an RF channel information transmitting step of sequentially transmitting at least one data stream corresponding to an RF channel to the unmanned vehicle communication module by the unmanned vehicle controller to perform a setting value transmitting process for the RF channel, in which when reception confirmation information for the data stream is received from the unmanned vehicle communication module, a data stream of next level is transmitted; and an initialization completing step of transmitting communication setting mode completion information to the unmanned vehicle communication module and receiving communication setting mode completion confirmation information from the unmanned vehicle communication module, by the unmanned vehicle controller, to complete initialization setting.

Preferably, the RF initialization setting method further includes: when the RF initialization setting method is applied to an automated material handling system in which a manufacturing facility includes a plurality of ports for receiving control information, a port number transmitting step of generating a data stream corresponding to a port number of the manufacturing facility by the unmanned vehicle controller in a state when an initialization mode is set between the unmanned vehicle controller and the unmanned vehicle communication module, to transmit the data stream to the unmanned vehicle communication module.

Preferably, the RF initialization setting method further includes: when the RF initialization setting method is applied to an automated material handling system which performs both IR communication and RF communication between the unmanned transporting device and the manufacturing facility, a communication medium information transmitting step of generating a data stream for selecting a communication medium corresponding to whether to perform IR communication or RF communication with the manufacturing facility, by the unmanned vehicle controller, in a state when an initialization mode is set between the unmanned vehicle controller and the unmanned vehicle communication module to transmit the data stream to the unmanned vehicle communication module.

Preferably, the initialization information transmitting step further includes: an unmanned vehicle ID transmitting step of generating a data stream corresponding to the unmanned ID therefor to the unmanned vehicle communication module, by the unmanned vehicle controller, in a state when an initialization mode is set between the unmanned vehicle controller and the unmanned vehicle communication module to transmit the data stream to the unmanned vehicle communication module, and the unmanned vehicle ID transmitting step is performed only one time for the unmanned transporting device.

BRIEF DESCRIPTION OF THE DRAWINGS

The above and other objects, features and advantages of the present invention will be more apparent from the following detailed description taken in conconfluence with the accompanying drawings, in which.

DETAILED DESCRIPTION OF THE PREFERRED EMBODIMENT

Hereinafter, a preferred embodiment according to the present invention will be described in detail with reference to the accompanying drawings. Since the description of the present invention is a mere embodiment for structural and functional description, it must not be interpreted that the scope of the present invention is limited by the embodiments described in the text. That is, since the embodiments can be variously changed and have various forms, it should be understood that the scope of the invention includes the equivalents for realizing the technical concept. Also, since the specific embodiments do not include all objects and effects presented by the present invention, the scope of the present invention is not limited by them. This invention can be implemented in many different forms without departing from technical aspects or main features.

Figure 4:
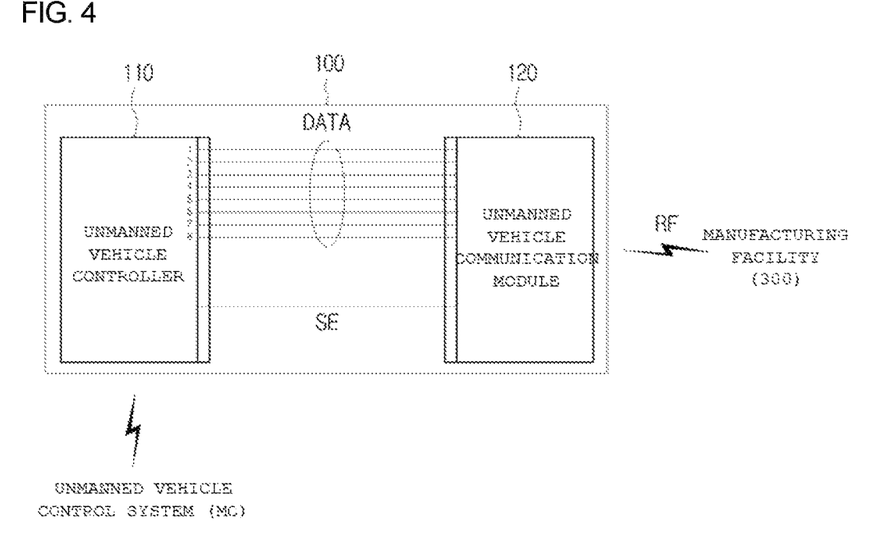
FIG. 4 is a view schematically illustrating an internal configuration of an unmanned transporting device in an automated material handling system to which the present invention is applied.

FIG. 4 is a view schematically illustrating an internal configuration of an unmanned transporting device in an automated material handling system to which the present invention is applied.

As illustrated in FIG. 4, in the automated material handling system to which the present invention is applied, the unmanned transporting device (100) is configured to include an unmanned vehicle controller (110) and an unmanned vehicle communication module (120).

The unmanned vehicle communication module (120) communicates with a manufacturing facility (300) according to an RF communication system. In this case, in the manufacturing facility (300), a unique ID corresponding to each manufacturing facility and RF channel information for performing RF communication with the unmanned vehicle communication module (120) are stored in advance.

That is, the unmanned transporting device (100) moves through a rail and stops in a position where each manufacturing facility (300) is provided to perform RF communication with the manufacturing facility (300) to perform a series of loading/unloading processes through the manufacturing facility (300).

In this case, the unmanned transporting device (100) is provided with the ID and channel information corresponding to the manufacturing facility (300) from an upper level unmanned vehicle control system (CM) in the unmanned vehicle controller (110) and registers the ID and channel information in an unmanned vehicle communication module (120) to perform a series of RF initialization setting processes. Further, the unmanned transporting device (100) is configured to include a barcode reader (not illustrated) to be provided with an RF initialization parameter including the ID and channel information corresponding to the manufacturing facility (300) from the barcode attached on the manufacturing facility (300). In this case, the barcode includes an ID and channel information of a manufacturing facility and each parameter may be distinguished by different characters to be printed.

Here, the unmanned vehicle controller (110) has the same structure as an optical communication based automated material handling system of the related art (see FIG. 1), and an input/output terminal which is coupled to the unmanned vehicle communication module (120) is formed of a plurality of data terminals (DATA) and one selecting terminal (SE). That is, the unmanned vehicle controller (110) is coupled to the communication module (120) through eight data terminals (DATA 1 to 8) and one selecting terminal (SE) to transmit and receive data with each other.

The unmanned vehicle controller (110) basically sets the selecting terminal (SE) to a second level (LOW) and transmits data to the unmanned vehicle communication module (120) through the data terminals (DATA). Further, in a state when the selecting terminal (SE) is the second level (LOW), the unmanned vehicle communication module (120) recognizes data which is applied through the data terminals (DATA) as loading/unloading related control data and converts the data into an RF signal to transmit the converted RF signal to the manufacturing facility (300).

In the optical communication based automated material handling system as illustrated in FIG. 1, the unmanned vehicle controller is basically configured so as not to transmit data to the data terminal (DATA) in the state when the selecting terminal (SE) is set to a second level (LOW).

Therefore, the present invention implements a function of the unmanned vehicle controller (110) to provide the RF initialization setting information to the unmanned vehicle communication module (120) through the data terminals (DATA) in a state when the selecting terminal (SE) is set to a first level (HIGH), by software. In this case, in a state when the selecting terminal (SE) is a first level (HIGH), the unmanned vehicle communication module (120) is configured to recognize and store the data applied through the data terminal (DATA) as RF initialization setting information to perform a series of RF initialization setting processes.

According to the present invention, an RF initialization setting function which is performed through a serial terminal which is not provided in the unmanned vehicle controller of the unmanned transporting device (100) configuring the optical communication based automated material handling system is performed using an existing input/output terminal so that the initialization setting for RF communication is performed by a simple method of upgrading only software without changing a structure of the unmanned vehicle controller of the existing optical communication based unmanned transporting device (100).

Next, a schematic operation of an unmanned transporting device which is performed in an RF communication based automated material handling system to which the present invention is applied will be described with reference to FIGS. 5 to 8.

Figure 5:
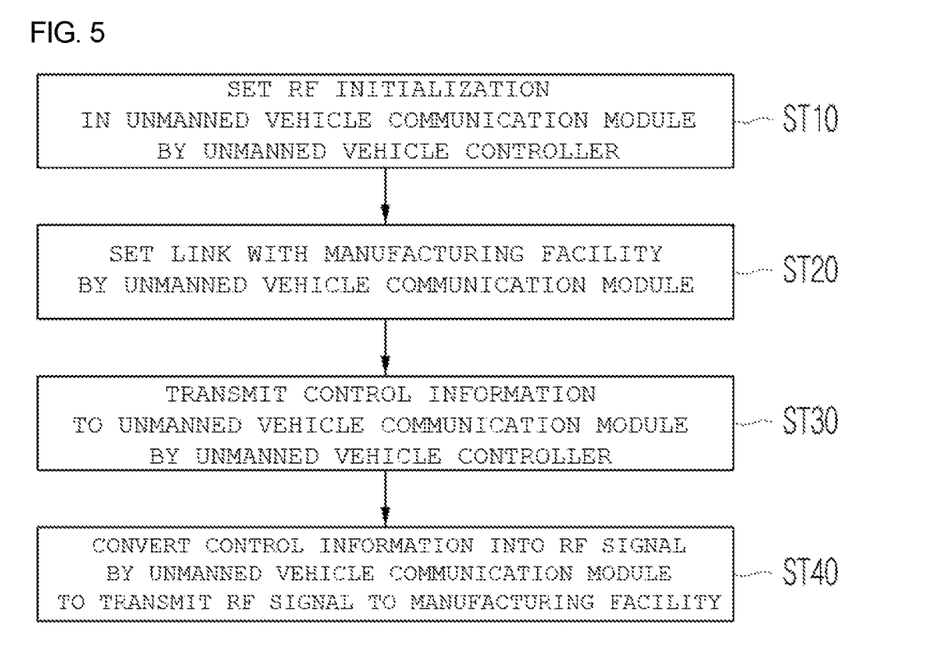
FIG. 5 is a flowchart for explaining a schematic operation of an unmanned transporting device performed in an RF communication based automated material handling system to which the present invention is applied.
Figure 6A:
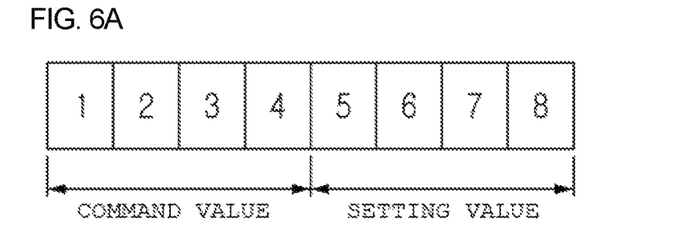
FIG. 6A is a view illustrating a data stream structure when initialization setting information which is transmitted from the unmanned vehicle controller to the unmanned vehicle communication module is transmitted.
Figure 6B:
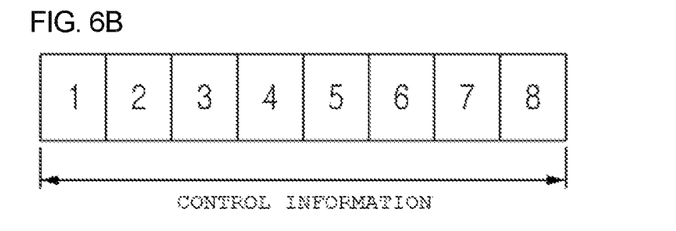
FIG. 6B is a view illustrating a data stream structure when control information which is transmitted from the unmanned vehicle controller to the unmanned vehicle communication module is transmitted.
Figure 7:
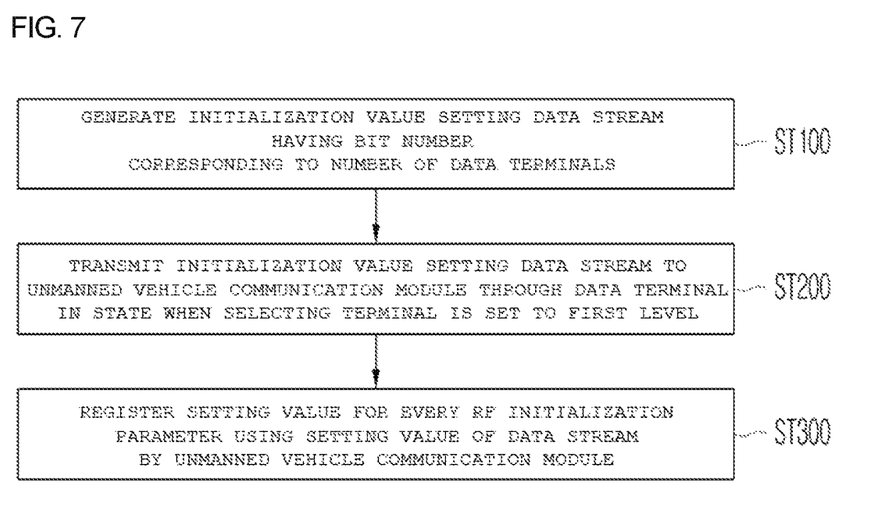
FIG. 7 is a flowchart for explaining an RF initialization setting process of the unmanned transporting device in FIG. 5.
Figure 8:
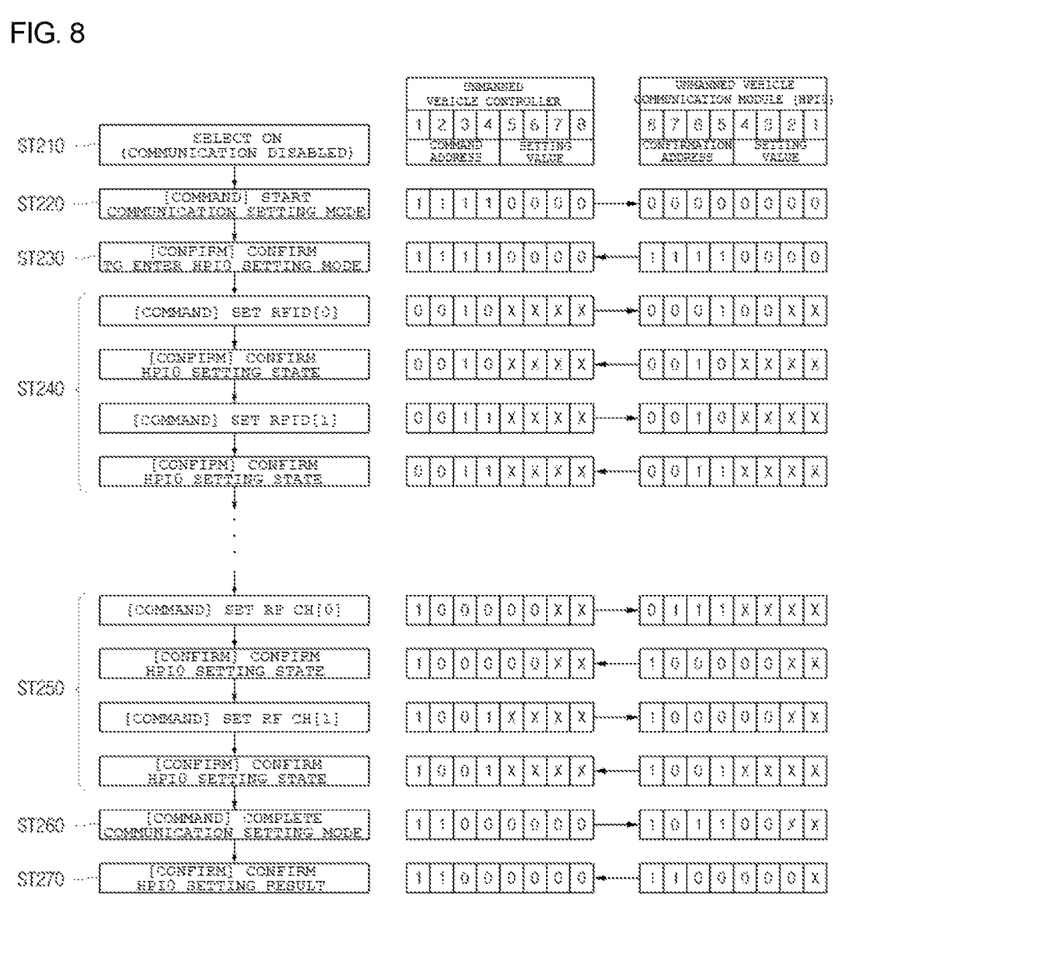
FIG. 8 is a view illustrating a data transmitting/receiving process of an RF initialization parameter in FIG. 7.

Here, FIG. 5 is a flowchart for explaining a schematic operation of an unmanned transporting device performed in an RF communication based automated material handling system to which the present invention is applied, FIG. 6A is a view illustrating a data stream structure when initialization setting information which is transmitted from the unmanned vehicle controller (110) to the unmanned vehicle communication module (120) is transmitted, FIG. 6B is a view illustrating a data stream structure when control information which is transmitted from the unmanned vehicle controller (110) to the unmanned vehicle communication module (120) is transmitted, FIG. 7 is a flowchart for explaining an RF initialization setting process of the unmanned transporting device (100) in FIG. 5, and FIG. 8 is a view illustrating a data transmitting/receiving process of an RF initialization parameter in FIG. 7.

First, referring to FIG. 5, communication modules which perform RF communication are provided in the unmanned transporting device (100) of the automated material handling system and the manufacturing facility (300), respectively. RF initialization information including RFID and RF channel information corresponding to the manufacturing facility (300) is registered in advance in the manufacturing facility (300) by a manufacturing facility control system (not illustrated).

Further, the unmanned transporting device (100) is provided with RF initialization information for each manufacturing facility (300) located on its moving route. In this case, the RF initialization information may be provided through the unmanned vehicle control system (MC). Further, the unmanned transporting device 100 obtains the RF initialization information from the barcode attached on the manufacturing facility 300 in a state when the unmanned transporting device 100 moves along the route to stop in a position where the manufacturing facility 300 is provided.

In the above-described state, the unmanned transporting device (100) performs the RF initialization setting process including RFID and RF information for the unmanned vehicle communication module (120) to perform RF communication with the corresponding manufacturing facility (300) (ST10).

That is, the unmanned vehicle controller (110) provides the RF initialization information including the RFID and the RF channel to the unmanned vehicle communication module (120) through the data terminals (DATA) in a state when the selecting terminal (SE) is set to a first level at which communication with the manufacturing facility (300) is disabled, that is, a HIGH state. The unmanned vehicle communication module (120) stores the data applied through the data terminal (DATA) when the selecting terminal is the first level (HIGH), as the RF initialization setting information. In this case, the data stream which is transmitted from the unmanned vehicle controller (110) to the unmanned vehicle communication module (120) through the data terminal (DATA) is formed of a command value and a setting value as illustrated in FIG. 6A. Further, the RFID is identification information for the manufacturing facility (300) and the RF channel is a data transmitting/receiving frequency with the manufacturing facility (300). For example, the RF channel may set to be a first frequency in accordance with an installation environment of the manufacturing facility (200) or may be set to be any one of a plurality of different frequencies which has been set in advance, such as a second frequency. The process thereof will be described in detail with reference to FIGS. 7 and 8.

Further, when the RF initialization setting is completed, the unmanned vehicle communication module (120) performs a link setting process with the manufacturing facility (300) using currently set RF initialization information (ST20). That is, the unmanned vehicle communication module (120) transmits RFID to the manufacturing facility (300) using the stored RF channel and the manufacturing facility (300) performs a confirmation process on the RFID.

In the meantime, when the RF initialization setting for the unmanned vehicle communication module (120) is completed, the unmanned vehicle controller (110) transmits control information for transporting a carrier to the manufacturing facility (300) to the unmanned vehicle communication module (120) (ST30). The unmanned vehicle controller (110) provides control information for transporting the carrier to the unmanned vehicle communication module (120) through the data terminal while setting the selecting terminal (SE) to a second level (LOW) at which communication with the manufacturing facility (300) is available.

Further, the unmanned vehicle communication module (120) converts a data stream applied through the data terminals (DATA) in a state when the selecting terminal (SE) is set to the second level (LOW), that is, a control information into an RF signal to transmit the converted RF signal to the manufacturing facility (300) (ST40). In this case, all bits of the data stream transmitted from the unmanned vehicle controller (110) to the unmanned vehicle communication module (120) through the data terminal (DATA) are formed of control information as illustrated in FIG. 6B.

The manufacturing facility 300 transports the carrier in accordance with the control information received from the unmanned vehicle communication module (120) to perform a series of loading/unloading processes.

Next, the RF initialization setting process (ST10 of FIG. 5) of the unmanned transporting device (100) will be described in detail with reference to FIGS. 7 and 8.

First, the unmanned vehicle controller (110) divides a setting value for each parameter for the RF initialization setting into predetermined bit number units and generates a data stream which is formed of setting values and command values in a predetermined bit unit and has a bit number corresponding to the number of data terminals (ST100).

In this case, the parameter for the RF initialization setting basically includes the RFID and the RF channel, and each parameter may be formed of at least one data stream. When the unmanned vehicle controller (110) has eight data terminals, as illustrated in FIG. 6, one data stream is formed of eight bits and the data area is divided into four-bit command value and four-bit setting value. When the RFID is 20 bit data and the RF channel is 9 bit data in the above-described environment, a total of five data streams are generated for 20 bit RFID and a total of three data streams are generated for 9 bit RF channel.

Next, the unmanned vehicle controller (110) sets the selecting terminal (SE) to the first level (HIGH) and performs a parallel communication with the unmanned vehicle communication module (120) through the data terminal (DATA) to transmit the RF initialization value in the data stream unit to the unmanned vehicle communication module (120) (ST200).

In this case, the unmanned vehicle communication module (120) recognizes the data stream received through the data terminal (DATA) when the selecting terminal (SE) is the first level (HIGH), as the RF initialization value setting related data. The unmanned vehicle communication module (120) sequentially disposes the unit setting values located in the setting value area in the data stream based on the command value in the command value area to register the setting value for each RF initialization parameter. For example, the unmanned vehicle communication module (120) sequentially disposes the five unit setting values obtained from the total of five data streams for the RFID command value to register a setting value corresponding to the RFID.

That is, as illustrated in FIG. 8, the unmanned vehicle controller (110) sets the selecting terminal (SE) to be the first level (HIGH) to be set to a Select On state (ST210). In this case, the Select On state is defined as a state in which the communication with the manufacturing facility (300) in the unmanned vehicle communication module (120) is disabled (communication disabled).

In the above-described state, the unmanned vehicle controller (110) transmits communication setting mode starting information to the unmanned vehicle communication module (120) (ST220) and receives the communication setting mode starting information from the unmanned vehicle communication module (120) therefor to change the mode to the inter-communication setting mode (ST230).

Next, the unmanned vehicle controller (110) transmits RFID information to the unmanned vehicle communication module (120) and receives setting state confirmation information for the currently transmitted RFID from the unmanned vehicle communication module (120) therefor to perform a setting operation of the RFID (ST240). For example, the RFID formed of 20 bits is divided into four-bit units to be sequentially transmitted through a setting value area of a total of five data streams. The unmanned vehicle communication module (120) recognizes a unit setting value of the data stream based on a previously contracted command value and sequentially disposes the unit setting values correspondingly to the command value to complete and register the setting value for the RFID. For example, a setting value corresponding to a command value "0010" is recognized as a first RFID and a setting value corresponding to a command value "0011" is recognized as a second RFID.

Further, the unmanned vehicle controller (110) transmits RF channel (CH) information to the unmanned vehicle communication module (120) and receives setting state confirmation information for a currently transmitted RF channel from the unmanned vehicle communication module (120) therefor to perform a setting operation of the RF channel (ST250). The RF channel information is registered by sequentially dividing and transmitting the corresponding setting value obtained through a setting value area of the total of three data streams by the unmanned vehicle controller (110) and combining the setting values by the same method as the RFID by the unmanned vehicle communication module (120) to complete and register a setting value for the RF channel.

Next, the unmanned vehicle controller (110) transmits communication setting mode completion information to the unmanned vehicle communication module (120) (ST260) and receives setting result confirmation information from the unmanned vehicle communication module (120) to complete the RF initialization process for the unmanned transporting device (100) (ST270).

In the meantime, in the above-described exemplary embodiment, even though only RFID and the RF channel are suggested as the RF initialization parameter of the unmanned transporting device (100), when at least two ports of the manufacturing facility (300) are provided, the port number of the manufacturing facility (300) may be added as the RF initialization setting parameter. Further, a setting operation thereof is the same as the above-described setting value registering process for the RFID and the RF channel.

Further, the present invention may also be carried out by being applied to an automated material handling system (for example, see FIG. 3) including both an IR communication module and an RF communication module in the unmanned transporting device (100). In this case, the unmanned vehicle controller (110) may add communication medium selecting information indicating which type of communication medium between IR optical communication and RF communication is used between the unmanned transporting device (100) and the manufacturing facility (300) to the RF initialization setting parameter.

Further, in the automated material handling system, a plurality of unmanned transporting devices communicates with one manufacturing facility (300) to sequentially perform different operations. For example, with respect to an arbitrary manufacturing facility (300), a first unmanned transporting device controls a first operation, a second unmanned transporting device controls a second operation, and a third unmanned transporting device controls a third operation.

In this case, the automated material handling system needs to confirm whether the communication with the first to third unmanned transporting devices in the manufacturing facility (300) is correctly performed. Therefore, to this end, IDs for the unmanned transporting devices, that is, unmanned vehicle IDs are registered and are transmitted to the manufacturing facility (300) so that the manufacturing facility (300) may manage a communication history with the unmanned transporting devices (100).

The unmanned vehicle ID registering process may also be set in the unmanned transporting device (100) by the same method as the above-described RF initialization parameter registering process and it is desirable that the first registration is made at the moment when a power of the unmanned transporting device (100) is on.

That is, the unmanned transporting device (100) may perform the RF initialization setting process for each manufacturing facility (300) while moving along a rail in a state when the unmanned vehicle ID thereof is registered in the unmanned vehicle communication module (120). For example, when it is determined that all the unmanned vehicle ID, a communication medium, the RFID, the RF channel, and the port number are registered in the unmanned vehicle communication module (120), the unmanned transporting device (100) changes the selecting terminal to a second level (LOW) to perform a series of communication link setting and control information transmitting process with the manufacturing facility (300).

As described above, it performs the RF initialization setting process using the input/output terminal of the unmanned vehicle controller, thereby easily changing the existing optical communication based automated material handling system to the RF communication based automated material handling system through a simple method using only software upgrade, without changing the structure of the unmanned vehicle controller which has been already provided.

Although embodiments of the present invention were described above, the spirit of the present invention is not limited thereto, changes and modifications substantially equivalent to the embodiment of the present invention should be construed as being included in the scope of the present invention, and the prevent invention may be changed in various ways within the scope of the present invention by those skilled in the art.

What is claimed is:

1. An RF initialization setting method of an unmanned transporting device in an automated material handling system which includes an unmanned transporting device configured to convert information transmitted through a data terminal in a state when a selecting terminal is set to a second level into an RF signal to transmit the converted RF signal to a manufacturing facility, and performs RF communication with the unmanned transporting device to transport a carrier to the manufacturing facility, the method comprising:
   a data stream generating step of generating one or more data streams formed of a setting value and a command value in a predetermined bit unit for the setting value for each RF initialization parameter and has a bit number corresponding to the number of data terminals by the unmanned vehicle controller of the unmanned transporting device, in which the one or more data streams are generated for said each RF initialization parameter;
   an initialization information transmitting step of setting a state of the selecting terminal to a first level and transmitting information in a data stream unit to an unmanned vehicle communication module through the date terminals, by the unmanned vehicle controller; and
   a setting value registering step of receiving the one or more data streams applied from the unmanned vehicle controller through the date terminals in a state when the selecting terminal is a first level and obtaining and sequentially disposing unit setting values based on command values of the received one or more data streams to regenerate and register the setting value for said each parameter, by the unmanned vehicle communication module.

2. The RF initialization setting method according to claim 1, wherein the initialization information transmitting step includes:
   an initialization mode setting step of transmitting communication setting mode starting information to the unmanned vehicle communication module and receiving communication setting mode starting confirmation information from the unmanned vehicle communication module, by the unmanned vehicle controller;
   an RFID information transmitting step of sequentially transmitting the one or more data streams corresponding to the RFID by the unmanned vehicle controller to the unmanned vehicle communication module to perform a setting value transmitting process for the RFID, in which when reception confirmation information for the one or more data streams are received from the unmanned vehicle communication module, the one or more data streams of next level are transmitted;
   an RF channel information transmitting step of sequentially transmitting the one or more data streams corresponding to an RF channel to the unmanned vehicle communication module by the unmanned vehicle controller to perform a setting value transmitting process for the RF channel, in which when reception confirmation information for the one or more data streams are received from the unmanned vehicle communication module, the one or more data streams of next level are transmitted; and
   an initialization completing step of transmitting communication setting mode completion information to the unmanned vehicle communication module and receiving communication setting mode completion confirmation information from the unmanned vehicle communication module, by the unmanned vehicle controller, to complete initialization setting.

3. The RF initialization setting method according to claim 2, further comprising:
   when the RF initialization setting method is applied to an automated material handling system in which a manufacturing facility includes a plurality of ports for receiving control information,
   a port number transmitting step of generating the one or more data streams corresponding to a port number of the manufacturing facility by the unmanned vehicle controller in a state when an initialization mode is set between the unmanned vehicle controller and the unmanned vehicle communication module, to transmit the one or more data streams to the unmanned vehicle communication module.

4. The RF initialization setting method according to claim 2, further comprising:
   when the RF initialization setting method is applied to an automated material handling system which performs both IR communication and RF communication between the unmanned transporting device and the manufacturing facility,
   a communication medium information transmitting step of generating the one or more data streams for selecting a communication medium corresponding to whether to perform IR communication or RF communication with the manufacturing facility, by the unmanned vehicle controller, in a state when an initialization mode is set between the unmanned vehicle controller and the unmanned vehicle communication module to transmit the one or more data streams to the unmanned vehicle communication module.

5. The RF initialization setting method according to claim 2, wherein the initialization information transmitting step further includes:
   an unmanned vehicle ID transmitting step of generating the one or more data streams corresponding to the unmanned ID therefor to the unmanned vehicle communication module, by the unmanned vehicle controller, in a state when an initialization mode is set between the unmanned vehicle controller and the unmanned vehicle communication module to transmit the one or more data streams to the unmanned vehicle communication module, an
   the unmanned vehicle ID transmitting step is performed only one time for the unmanned transporting device.

6. The RF initialization setting method according to claim 3, wherein the initialization information transmitting step further includes:
   an unmanned vehicle ID transmitting step of generating the one or more data streams corresponding to the unmanned ID therefor to the unmanned vehicle communication module, by the unmanned vehicle controller, in a state when an initialization mode is set between the unmanned vehicle controller and the unmanned vehicle communication module to transmit the one or more data streams to the unmanned vehicle communication module, and
   the unmanned vehicle ID transmitting step is performed only one time for the unmanned transporting device.

7. The RF initialization setting method according to claim 4, wherein the initialization information transmitting step further includes:

an unmanned vehicle ID transmitting step of generating the one or more data streams corresponding to the unmanned ID therefor to the unmanned vehicle communication module, by the unmanned vehicle controller, in a state when an initialization mode is set between the unmanned vehicle controller and the unmanned vehicle communication module to transmit the one or more data streams to the unmanned vehicle communication module, and the unmanned vehicle ID transmitting step is performed only one time for the unmanned transporting device.

* * * * *